United States Patent [19]

Kerzman et al.

[11] Patent Number: 5,719,783
[45] Date of Patent: Feb. 17, 1998

[54] METHOD AND APPARATUS FOR PERFORMING TIMING ANALYSIS ON A CIRCUIT DESIGN

[75] Inventors: Joseph P. Kerzman, New Brighton; Duane G. Kurth, Wyoming; Douglas A. Fuller, Eagan, all of Minn.

[73] Assignee: Unisys Corporation, Blue Bell, Pa.

[21] Appl. No.: 597,847

[22] Filed: Feb. 7, 1996

[51] Int. Cl.[6] .................................................. G06F 17/50
[52] U.S. Cl. ............................................. 364/488; 364/578
[58] Field of Search .................................. 364/488, 489, 364/490, 491, 578

[56] References Cited

U.S. PATENT DOCUMENTS

| | | | |
|---|---|---|---|
| 5,095,454 | 3/1992 | Huang | 364/578 |
| 5,168,455 | 12/1992 | Hooper | 364/490 |
| 5,210,700 | 5/1993 | Tom | 364/489 |
| 5,396,435 | 3/1995 | Ginetti | 364/489 |
| 5,426,591 | 6/1995 | Ginetti et al. | 364/489 |
| 5,490,268 | 2/1996 | Matsunaga | 395/550 |
| 5,555,187 | 9/1996 | Spyrou | 364/490 |
| 5,576,979 | 11/1996 | Lewis et al. | 364/578 |
| 5,619,418 | 4/1997 | Blaauw et al. | 364/489 |

OTHER PUBLICATIONS

Tufte, "CML III Bipolar Standard Cell Library", Proceedings of the 1988 Bipolar Circuits and Technology Meeting, Minneapolis, Minnesota, Sep., 1988, pp. 180–182.

*Primary Examiner*—Kevin J. Teska
*Assistant Examiner*—Leigh Marie Garbowski
*Attorney, Agent, or Firm*—Nawrocki, Rooney & Sivertson, P.A.

[57] ABSTRACT

A method and apparatus for efficiently performing timing analysis on a circuit design. The present invention essentially provides a hybrid between a path enumeration algorithm and a critical path algorithm. As such, the present invention increases the number and degree of timing violations reported by a Critical Path Analysis (CPA) algorithm, while maintaining a performance advantage over a Path Enumeration (PE) algorithm. This is accomplished by providing a number of "pseudo" clocks to selected latches within the circuit design database, thereby tricking the CPA algorithm into reporting more timing violations than would otherwise be reported.

12 Claims, 16 Drawing Sheets

| LATCH | CLOCK | CLOCK GROUP | DESTINATION |
|---|---|---|---|
| LATCH A<br>LATCH B<br>LATCH C | PHASE 1A<br>PHASE 1A<br>PHASE 1A | SOURCE-A | LATCH Y |

FIG. 4B

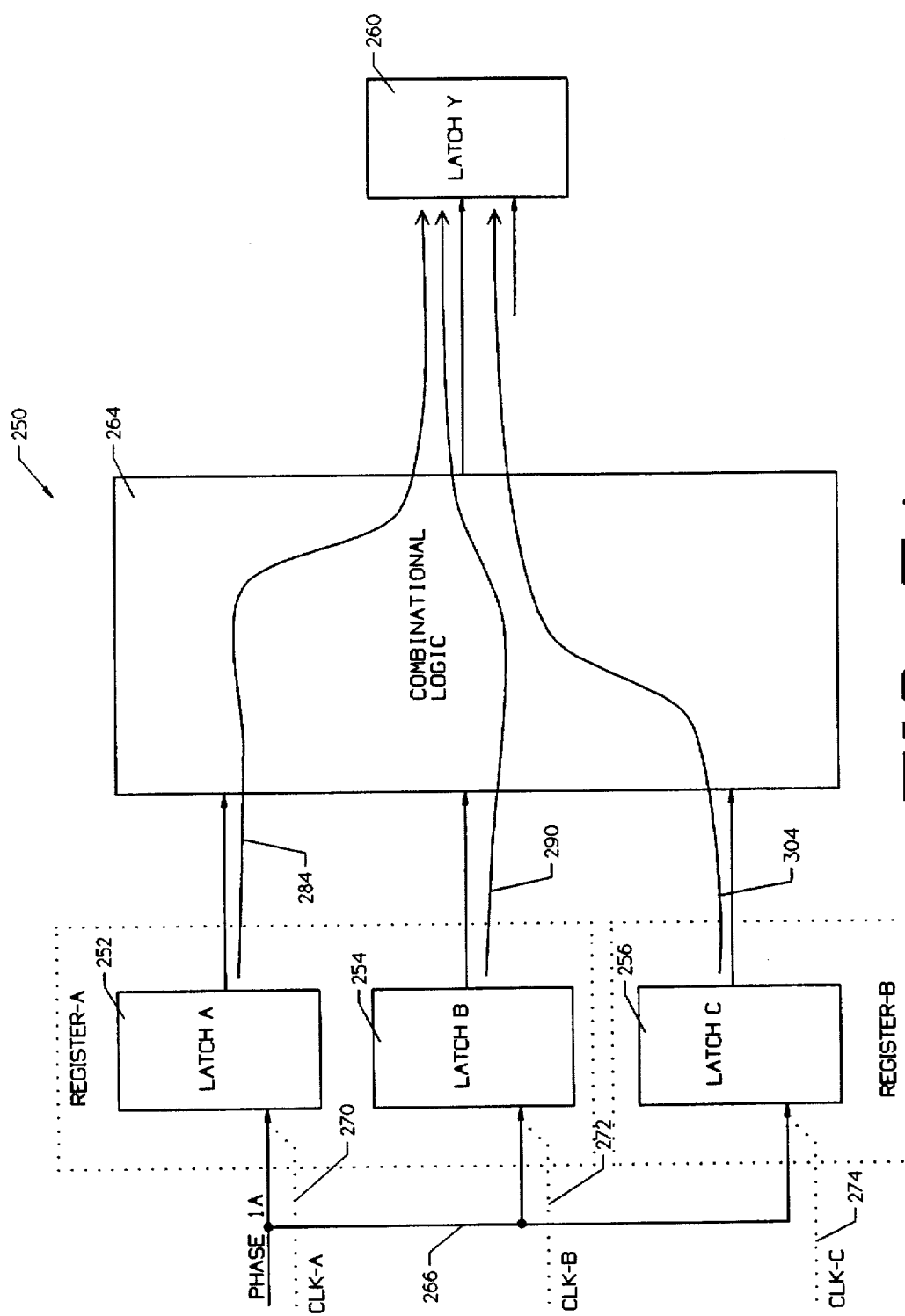

METHOD AND APPARATUS FOR PERFORMING TIMING ANALYSIS ON A CIRCUIT DESIGN

CROSS REFERENCE TO CO-PENDING APPLICATIONS

The present application is related to U.S. patent application Ser. No. 08/598,506, filed Feb. 7, 1996, entitled method and apparatus for performing drive strength adjust optimization in a circuit design, and U.S. patent application Ser. No. 08/597,931, filed Feb. 7, 1996, entitled method and apparatus for resolving conflicts between all substitution recommendations provided by a drive strength adjust tool, which are both assigned to the assignee of the present invention and are both incorporated herein by reference.

BACKGROUND OF THE INVENTION

1. Field of the Invention

The present invention generally relates to the optimization of electric circuit designs and more particularly relates to the performance of timing analysis on such circuit designs.

2. Description of the Prior Art

The advancement of integrated circuit, printed circuit board and other related technologies is advancing at a very rapid rate. The latest generation of integrated circuits can incorporate over four times the circuitry than was possible just a few years ago. Further, circuit board and multi-chip module technology has allowed much denser circuit board designs. These and other developments have allowed the development of increasingly complex and high speed computer systems.

The design of such computer systems has become increasingly difficult and time consuming. To maximize performance and minimize the size and power of such computer system, designers often implement much of the hardware in a number of integrated circuits. For maximum performance, the integrated circuits are often custom or semi-custom designed. Each integrated circuit may contain several hundred thousand gates, and each gate must be placed and routed in accordance with the overall computer system specification, all on a die typically measuring less than 625 mils on a side.

To design such a computer system, the designer typically produces an overall system specification. The overall system specification defines the overall function of the computer system, including the power and timing requirements thereof. Because of the size and complexity of such computer systems, system designers often partition the overall design into a number of blocks, wherein each of the blocks performs a dedicated function. Partitioning is typically continued until the size of each of the sub-blocks is of a manageable size. A specification for each of the sub-blocks is then written to define the function, timing and power requirements thereof. Often, one or more of the sub-blocks are implemented as an integrated circuit.

After the sub-block specifications have been defined, logic designers typically enter a schematic into a design database for each sub-block, using selected components from a component library. The schematic is typically entered via a database editor on an engineering workstation, and the design database is typically stored therein.

The component library may include a number of cells wherein each of the cells implements a different function. For example, the component library may include NAND gates, NOR gates, XOR gates, registers, latches, I/O cells, etc. Each of the cells typically have a number of "representations" stored in the component library. For example, a cell may have a "symbolic representation", a "schematic representation", and a "physical representation". Further, each of the individual cells may have a logically equivalent component with a different drive strength. When entering the schematic, the designer typically provide the "symbolic representation" directly on the schematic sheet via the database editor, and interconnects the symbols to achieve the desired function.

After the schematic has been entered into the design database, the schematic may be processed, or expanded, into a design netlist. The design netlist typically identifies each of the library cells that are used in the schematic, and further identifies the interconnections therebetween. The netlist is often written in an EDIF (Electronic Design Interface Format) format. The EDIF format is an industry wide standard, developed to allow the design netlist to be compatible with various software programs developed by different vendors.

The resulting design netlist may then be provided to a place and route tool. There are a number of place and route tools available on the market today. The place and route tool may read the "physical representation" of each cell within the design and place the physical representation within an imaginary two dimensional box. For integrated circuit designs, the imaginary box often corresponds to the outer periphery of the resulting integrated circuit die. Once all of the cells have been placed, the place and route tool interconnects the cells in accordance with the design netlist. Depending on the technology and the power bussing strategy of the component library, the place and route tool may provide the required interconnections (or routes) using up to five layers of metal.

After the place and route netlist is generated, the designer may use an extraction tool to extract an RC file therefrom. The extraction tool may process the place and route netlist and may determine the resistance, capacitance, or any other parameters selected by the designer, for each net in the design. For example, the extraction tool may determined the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

After the extraction tool provides an RC file for the design, the RC file and the original netlist may be provided to a timing analysis tool. The timing analysis tool may process the netlist and the RC file to determine the timing of predetermined circuit paths within the design. Part of the pre-processing performed by the timing analysis tool may include reading the timing information from the component library for each of the cells used in the design. For example, the timing information stored in the component library may include parameters such as a base delay, and delay per unit of capacitance. The timing analysis tool may use the timing information, along with the RC file to determine the delay for each cell within the design. Thereafter, the timing analysis tool may identify predetermined timing paths within the design, and add the delay for each of the cells to determine an overall path delay for each timing path. The timing analysis tool may then report all timing paths that have an overall path delay that falls outside of a predetermined timing specification.

Prior art timing analysis tools typically use either a path enumeration algorithm or a critical path algorithm. The path enumeration algorithm identifies all timing paths within the design, and calculates the overall delay therefor. Thus, the path enumeration algorithm calculates the overall delay for all timing paths, regardless of whether they fall inside or outside of the timing specification. The advantage of the path enumeration algorithm is that all timing paths can be identified in a single run. However, for large designs, this may require a prohibitively long run time.

In contrast, the critical path algorithm typically only identifies the worst case timing paths between registers, and calculates the overall delay therefor. The advantage of the critical path algorithm is that the run times may be significantly shorter than for the path enumeration algorithm. However, because only worst case timing paths are identified, the critical path algorithm may require a number of iterations to identify all of the timing paths that fall outside of the timing specification. For example, if two timing paths fall outside of the timing specification, the critical path algorithm may only identify the worst case one of the two timing paths during a first iteration. Thus, to identify the second timing path, the designer must correct or mask the identified worst case timing path, and execute another iteration. As can readily be seen, for circuit designs having a number of timing paths that fall outside of the timing specification, a substantial number of iterations may be required.

In addition to the above, drive strength adjust tools may be used in conjunction with one or more of the above referenced timing analysis algorithms. Drive strength adjust tools are programs that identify cells within a circuit design for substitution with a logically equivalent cell having a different drive strength, thereby mitigating timing violations identified by the timing analysis tool. For example, a drive strength adjust tool may substitute a cell with a logically equivalent cell having a higher drive strength to reduce the overall delay of a timing path. One such approach is suggested in an article entitled "CML III Bipolar Standard Cell Library", by Brian N. Tufte (Proceedings of the 1988 Bipolar Circuits Conference, Minneapolis, Minn., 1988). Tufte suggests using a software tool called SPEN (Speed Power Enhancement Program) to identify cells within the design that could be replaced by a higher power cell to reduce the delay of the corresponding timing path.

It is recognized that conflicts may arise if two or more of the timing paths include one or more common cells. For example, the drive strength adjust tool may increase the drive strength of one of the common cells, to increase the performance of a first timing path. However, this substitution may decrease the performance of a second timing path. Typically, the designer is left to resolve these conflicts.

Drive strength adjust tools are often used in conjunction with a timing analysis tool that uses either a path enumeration algorithm or a critical path algorithm. The path enumeration algorithm may identify all timing paths that fall outside of the timing specification, and thus may provide the designer with the necessary information to resolve any conflicts. However, as indicated above, the path enumeration algorithm may require a prohibitively long run time.

In contrast, the critical path algorithm may have a significantly shorter run time, but may identify only the worst case timing paths between registers. Not only are multiple iterations required to identify all timing paths that fall outside of the timing specification, but the critical path algorithm may not provide the designer with related timing paths during a particular iteration, thereby making it difficult to resolve any conflicts that may arise. That is, the designer may make a cell substitution during a first iteration, only to cause a second timing path to fall outside of the timing specification. As can readily be seen, the combination of the critical path algorithm and a drive strength adjust tool may not produce a converging solution.

SUMMARY OF THE INVENTION

The present invention overcomes many of the disadvantages of the prior art by providing a method and apparatus for efficiently performing timing analysis on a circuit design. The present invention essentially provides a hybrid between the path enumeration algorithm and the critical path algorithm. As such, the present invention increases the number and degree of timing violations reported by a Critical Path Analysis (CPA) algorithm, while maintaining a performance advantage over a Path Enumeration (PE) algorithm. This is accomplished by providing a number of "pseudo" clocks to selected latches within the circuit design database, thereby tricking the CPA algorithm into reporting more timing violations than would otherwise be reported.

In addition to the advantages recited above, the present invention allows drive strength adjust tools to be executed in a much more efficient manner. As indicated above, the present invention essentially provides a hybrid between the path enumeration algorithm and the critical path algorithm. Thus, the present invention may provide relatively fast run times, and may also provide the designer with sufficient timing paths to resolve any potential conflicts that may arise. Further, rather than having the designer resolve these conflicts, it is contemplated that a drive strength adjust tool may be provided that includes a resolving means for resolving any conflicts. One such drive strength adjust program is disclosed in the above referenced U.S. patent application Ser. No. 08/598,506, which has been incorporated herein by reference.

In an exemplary embodiment of the present invention, a data processing system is provided for identifying timing violations in a circuit design. The circuit design may be represented in a circuit design database including a number of source latches and a number of destination latches, with combinational logic therebetween. It is contemplated that a number of source clocks may be provided, such that each of the number of source clocks controls one or more of the number of source latches.

In the exemplary embodiment, the data processing system may be programmed in accordance with a critical path algorithm. Further, it is contemplated selected source latches, that are controlled by a common source clock, may be grouped together to define a source clock group. In such a configuration, the data processing system may identify a worst case timing path from each source clock group to each destination latch, through the combinational logic.

In accordance with the present invention, the data processing system may include an introducing means for introducing a number of pseudo clocks corresponding to selected source latches. Because each source clock group may be defined to include a number of source latches having a common source clock, the introduction of additional pseudo clocks may increase the number of source clock groups within the circuit design. The increase in number of source clock groups may thus cause the critical path algorithm to identify more worst case timing paths through the circuit design.

In addition to the above, it is contemplated that the introducing means may determine which of the latches are logically related. For example, selected source latches may correspond to a functional register within the circuit design database, and may be controlled by a common source clock. In this configuration, it is contemplated that the introducing means may only provide a selected number of pseudo clock to the source latches corresponding to each functional register, rather than providing a pseudo clock to each source latch associated therewith. An advantage of this approach is that the run time required to perform a particular timing analysis iteration may be reduced, while still maintaining an adequate path coverage.

In a preferred embodiment, a state map may be provided to the introducing means to indicate the functional relationship between the number of source latches. The state map may be processed by a processing means to determine which of the selected ones of the source latches are related, and to determine the desired number and placement of the pseudo clocks within the circuit design.

It is contemplated that the data processing system may further include an analyzing means coupled to the identifying means for analyzing the number of worst case timing paths. The analyzing means may calculate the delay for the number of worst case timing paths identified by the identifying means. The delay of each of the number of worst case timing paths may be compared to a predetermined timing specification via a comparing means. The comparing means may compare the overall delay of each of the worst case timing paths with a predetermined specification, or may preferably compare the resulting setup and hold times at each of the destination latches with predetermined setup and hold specifications.

It is contemplated that the above referenced combinational logic may include a number of components selected from a component library, wherein predetermined components of the component library have at least one corresponding logically equivalent component with a different drive strength. Further, each of the number of worst case timing path may include a number of components from the component library.

The data processing system may thus include a substituting means for substituting selected components along the worst case timing paths with a corresponding logically equivalent component having a different drive strength. The substituting means may include a resolving means for resolving any conflicts identified by the substituting means, particularly if a substituted component resides in two or more of the worst case timing paths. It is contemplated that the resolving means may resolve any conflicts in accordance with a predetermined priority scheme. One such approach is disclosed in the above-referenced U.S. patent application Ser. No. 08/597,931, which has been incorporated herein by reference.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 4B is a table showing the worst case timing paths traced by the critical path algorithm for the diagram of FIG. 4A;

FIG. 5A is a block diagram showing a first exemplary embodiment of the present invention wherein a number of pseudo clocks are provided to selected ones of the source latches to increase the number of source clock groups;

DETAILED DESCRIPTION OF THE PREFERRED EMBODIMENTS

Figure 1:
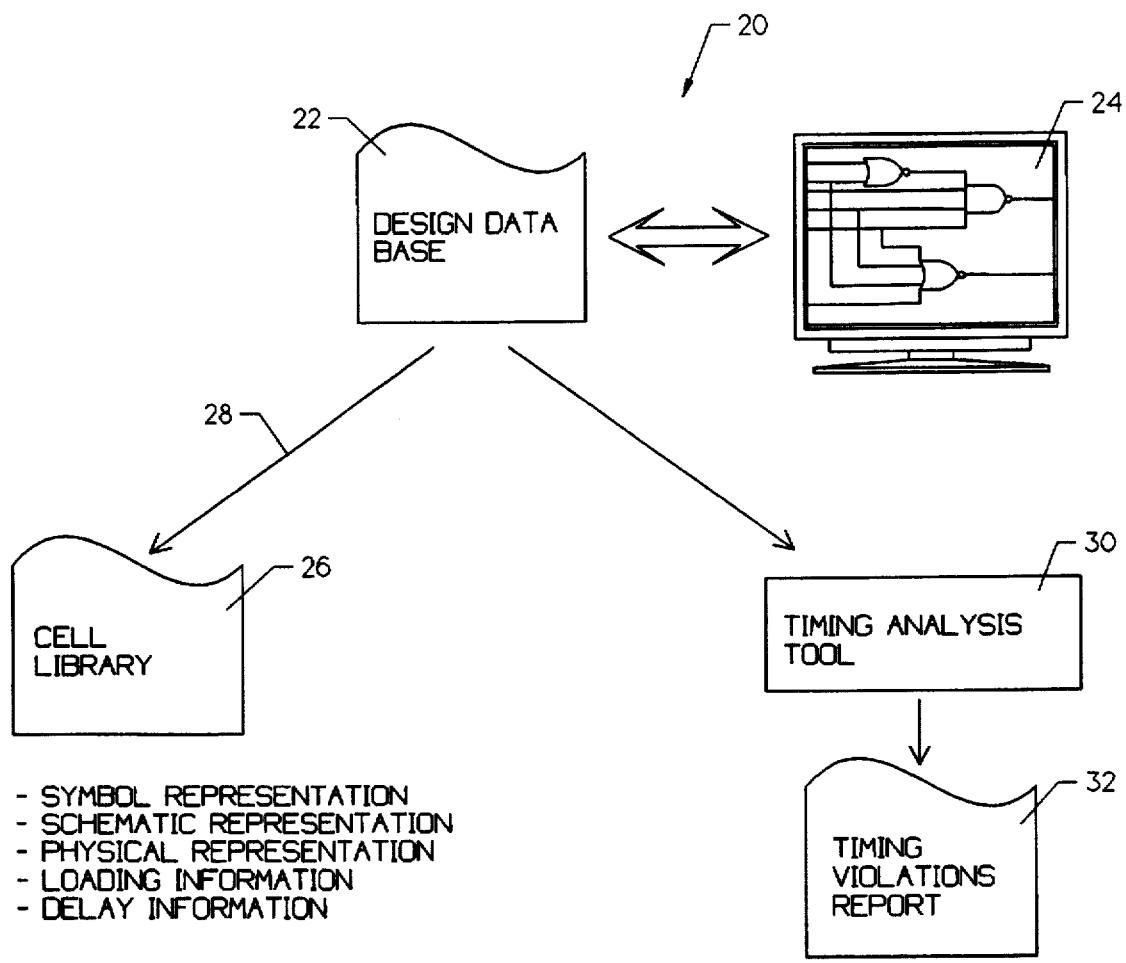
FIG. 1 is a block diagram showing a design database, a cell library, and a timing analysis tool.

FIG. 1 is a block diagram showing a design database 22, a cell library 26, and a timing analysis tool 30. The timing analysis tool 30 may be used to help verify that the design database 22 meets a predefined timing specification. The diagram is generally shown at 20.

Initially, a functional description of the desired circuit is input into the design database 22. This may be accomplished in a number of ways, but typically logic designers enter a schematic using selected components from the component library 26. The schematic is typically entered via a database editor on an engineering workstation as shown at 24.

The component library 26 may include a number of cells wherein each of the cells implements a different function. For example, the component library may include NAND gates, NOR gates, XOR gates, registers, latches, I/O cells, etc. Further, each of the cells typically have a number of "representations" stored in the component library 26. For example, a cell may have a "symbolic representation", a "schematic representation", and a "physical representation". Finally, each of the cells may have a logically equivalent component with a different drive strength. When entering the schematic, the designer typically provide the "symbolic representation" directly on the schematic sheet via the database editor as shown at 24, and interconnects the symbols to achieve the desired function.

After the schematic has been entered into the design database 22, the schematic may be processed, or expanded, into a design netlist (not shown). The design netlist typically identifies each of the library cells that are used in the schematic, and further identifies the interconnections therebetween. The netlist is often written in an EDIF (Electronic Design Interface Format) format. The EDIF format is an industry wide standard, developed to allow the design netlist to be compatible with various software programs developed by different vendors.

The resulting design netlist may then be provided to a place and route tool (not shown). The place and route tool may read the "physical representation" of each cell within the design and place the physical representation within an imaginary two dimensional box. For integrated circuit designs, the imaginary box often corresponds to the outer periphery of the resulting integrated circuit die. Once all of the cells have been placed, the place and route tool interconnects the cells in accordance with the design netlist. Depending on the technology and the power bussing strategy of the component library, the place and route tool may provide the required interconnections (or routes) using up to five layers of metal.

The output of the place and route tool is stored in the design database 22. In most large designs, the place and route netlist is hierarchical in nature. Thus, the place and route netlist typically only identifies the placement coordinates and orientation of each of the cells within the design, and does not contain the actual physical representation of each cell. Rather, the place and route netlist contains pointers 28 to the physical representations stored in the component library 26. Thus, if a particular cell is used a number of times within the design, only one copy of the physical representation is required to be stored. The place and route netlist typically also identifies the interconnections, or routes, by the coordinates of the starting, ending, and any other points where the route changes direction. Further, the width of the route is also identified.

After the place and route netlist is generated, the designer may use an extraction tool (not shown) to extract an RC file therefrom. The extraction tool may process the place and route netlist and may determine the resistance, capacitance, or any other parameters selected by the designer, for each net in the design. For example, the extraction tool may determined the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file (not shown), which may be read by the extraction tool.

After the extraction tool provides an RC file for the design, the RC file and the original design netlist may be provided to a timing analysis tool 30. The timing analysis tool 30 may process the netlist and the RC file to determine the timing of predetermined circuit paths within the design. Part of the pre-processing performed by the timing analysis tool 30 may include reading the timing information from the component library 26 for each of the cells used in the design. For example, the timing information stored in the component library 26 may include parameters such as a base delay, and delay per unit of capacitance. The timing analysis tool 30 may use the timing information, along with the RC file to determine the delay for each cell within the design. Thereafter, the timing analysis tool 30 identifies predetermined timing paths within the design, and adds the delay for each of the cells to determine an overall path delay for each timing path. The timing analysis tool 30 may then report all timing paths that have an overall path delay that falls outside of a predetermined timing specification, as shown at 32.

Prior art timing analysis tools 30 often use either a path enumeration algorithm or a critical path algorithm. The path enumeration algorithm typically identifies all timing paths within the design, and calculates the overall delay therefor. Thus, the path enumeration algorithm calculates the overall delay for all timing paths, regardless of whether they fall inside or outside of the timing specification. The advantage of the path enumeration algorithm is that all timing paths can be identified in a single iteration. However, for large designs, this may require a prohibitively long run time.

In contrast, the critical path algorithm typically only identifies the worst case timing paths between registers or latches, and calculates the overall delay therefor. The advantage of the critical path algorithm is that the run times may be significantly shorter than for the path enumeration algorithm. However, because only worst case timing paths are identified, the critical path algorithm may require a number of iterations to identify all of the timing paths that fall outside of the timing specification. For example, if two timing paths fall outside of the timing specification, the critical path algorithm typically only identifies the worst case one of the two timing paths during a first iteration. Thus, to identify the second timing path, the designer must correct or mask the identified worst case timing path, and execute another iteration. As can readily be seen, for circuit designs having a number of timing paths that fall outside of the timing specification, a substantial number of iterations may be required.

In addition to the above, drive strength adjust tools (not shown) may be used in conjunction with one or more of the above referenced timing analysis algorithms. Drive strength adjust tools are programs that identify cells within a circuit design for substitution with a logically equivalent cell having a different drive strength, to mitigate timing violations identified by the timing analysis tool 30. For example, a drive strength adjust tool may substitute a cell with a logically equivalent cell having a higher drive strength to reduce the overall delay of a timing path.

Figure 8:
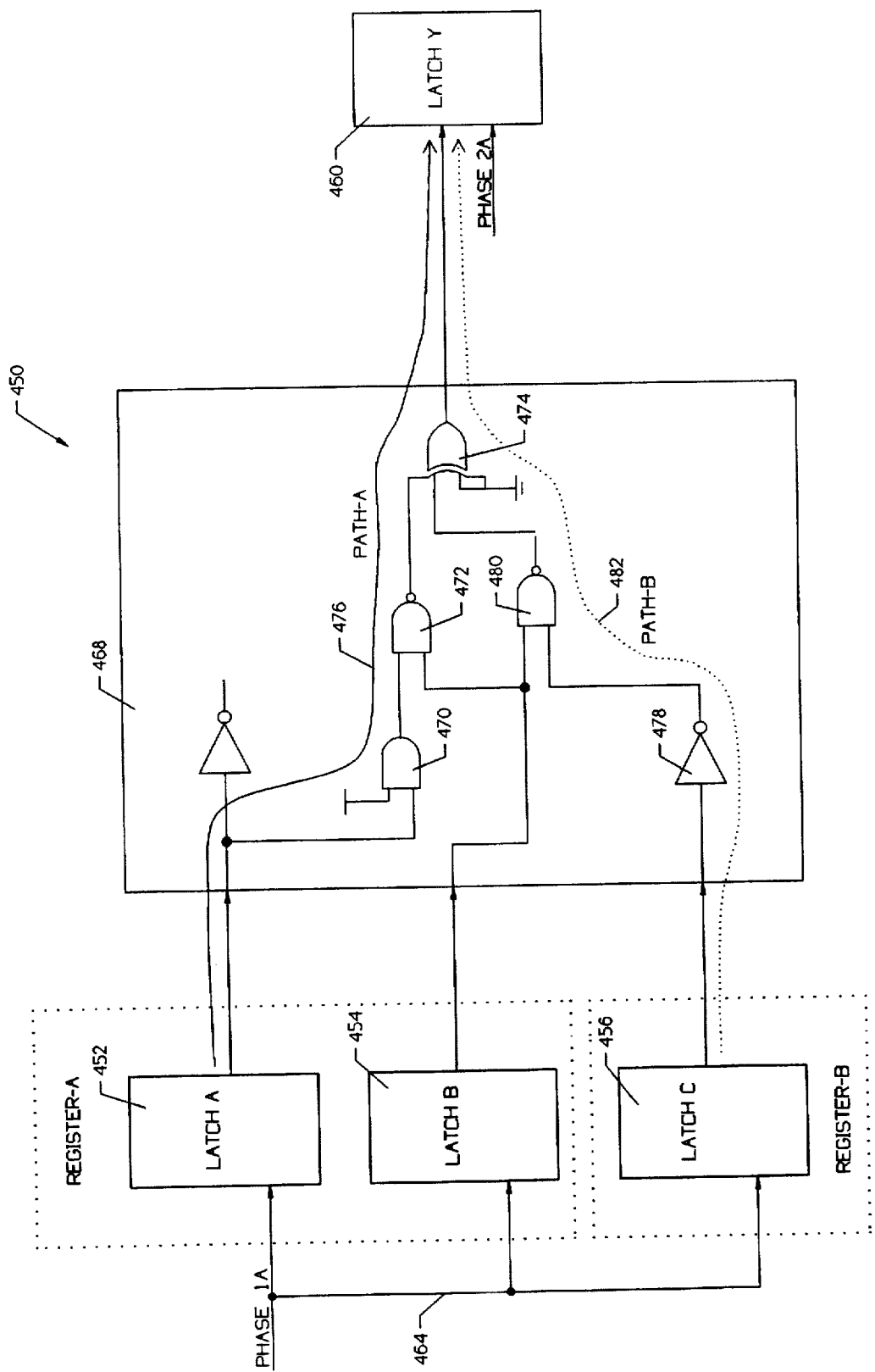
FIG. 8 is a block diagram showing a number of timing paths having a common component.

It is recognized that conflicts may arise if two or more of the timing paths identified by the timing analysis tool 30 include one or more common cells (see FIG. 8). For example, the drive strength adjust tool may increase the drive strength of one of the common cells to increase the performance of a first timing path. However, this substitution may decrease the performance of a second timing path. Typically, the designer is left to resolve these conflicts.

An advantage of the path enumeration algorithm is that all timing paths that fall outside of the timing specification may be identified in a single iteration, and thus may provide the designer with the information necessary to resolve any conflicts that may arise. However, as indicated above, the path enumeration algorithm may require a prohibitively long run time. In contrast, the critical path algorithm may have a significantly shorter run time, but may only identify the worst case timing paths between registers. Thus, not only are multiple iterations required to identify all timing paths that fall outside of the timing specification, but the critical path algorithm may not provide the designer with related timing paths during a particular iteration, thereby making it difficult to resolve any conflicts that may arise. That is, designer may make a cell substitution during a first iteration, only to cause a second timing path to fall outside of the timing specification. As can readily be seen, the combination of the critical path algorithm and a drive strength adjust tool may not produce a converging solution.

Figure 2A:
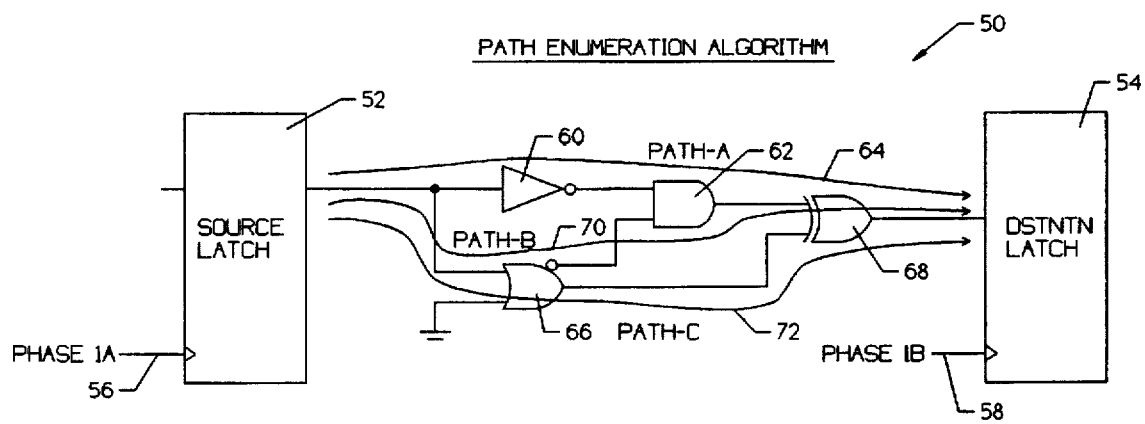
FIG. 2A is a schematic diagram illustrating a typical path enumeration algorithm used for timing analysis.

FIG. 2A is a schematic diagram illustrating a typical path enumeration algorithm used for timing analysis. The diagram is generally shown at 50. The path enumeration algorithm typically identifies all timing paths within the design, and calculates the overall delay therefor. Thus, the path enumeration algorithm calculates the overall delay for all timing paths, regardless of whether they fall outside or inside of the timing specification. The advantage of the path enumeration algorithm is that all timing paths can be identified in a single run. However, for large designs, this may require a prohibitively long run time.

A source latch 52 and a destination latch 54 are shown, with combinational logic therebetween. For illustration purposes, the source latch 52 is controlled by a first clock 56 and the destination latch 54 is controlled by a second clock 58. The first clock 56 and the second clock 58 may be out of phase with one another as shown in FIG. 2C.

When the first clock 56 transitions, the data stored in the first latch 52 is released and is provided to the combinational logic. The data must pass through the combinational logic and arrive at the second latch 54 before the second clock 58 transitions to latch the resulting data. Further, the second latch 54 may have predefined setup and hold time requirements that must be met.

The path enumeration algorithm may calculate the delay for path-A 64, path-B 70 and path-C 72. Path-A includes inverter 60, and-gate 62 and exclusive-or gate 68 as shown. Path-B includes or-gate 66, and-gate 62 and exclusive-or gate 68 as shown. Finally, path-C includes or-gate 66 and exclusive-or gate 68 as shown.

Figure 2B:
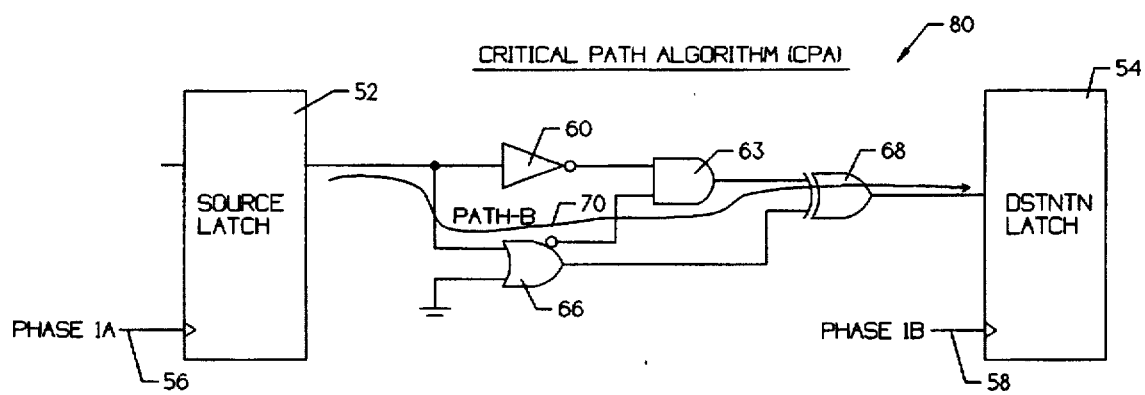
FIG. 2B is a schematic diagram illustrating a typical critical path algorithm used for timing analysis.
Figure 2C:
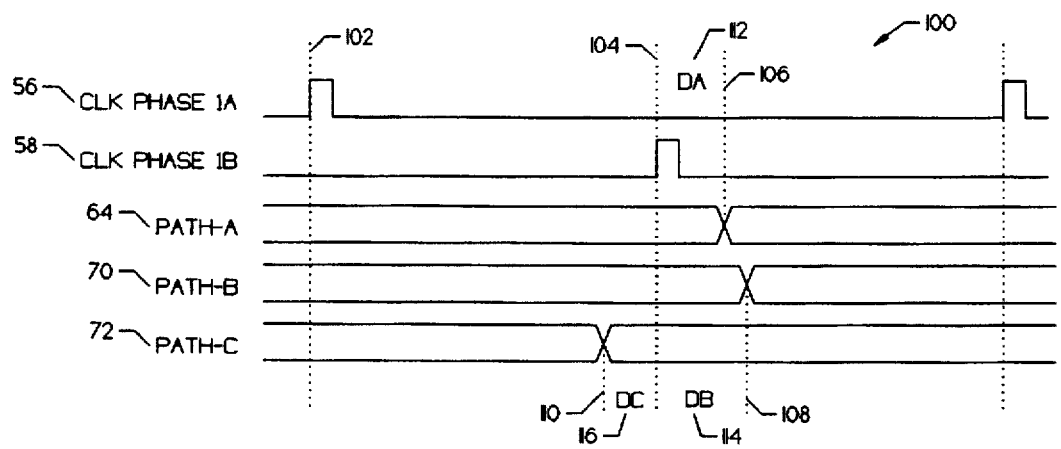
FIG. 2C is a timing diagram showing illustrative critical paths for the schematic diagrams of FIG. 2A and FIG. 2B.

Referring to FIG. 2C, the second clock 58 may transition at time 104. However, for path-A, the data may not arrive at the destination latch 54 until time 106, which is after the second clock 58 transitions. This is shown by DA 112. Similarly, for path-B, the data may not arrive at the destination latch 54 until time 108, which is after the second clock 58 transitions. This is shown by DB 114. Finally, for path-C, the data may arrive at the destination latch 54 before the second clock 58 transitions as indicated by DC 116. Thus, path-C may meet the timing specification and may be latched into the destination latch 54.

As can readily be seen, the advantage of the path enumeration algorithm is that all timing paths, regardless of whether they fall inside or outside of a predetermined timing specification, can be identified in a single run. However, for large designs, this may require a prohibitively long run time.

FIG. 2B is a schematic diagram illustrating a typical critical path algorithm used for timing analysis. The diagram is generally shown at 80. The critical path algorithm may only identify the worst case timing paths between registers or latches, and may calculate the overall delay therefor. The advantage of the critical path algorithm is that the run times may be significantly shorter than for the path enumeration algorithm. However, because only worst case timing paths are identified, the critical path algorithm may require a number of iterations to identify all of the timing paths that fall outside of the timing specification.

A source latch 52 and a destination latch 54 are shown, with combinational logic therebetween. For illustration purposes, the source latch 52 is controlled by a first clock 56 and the destination latch 54 is controlled by a second clock 58. The first clock 56 and the second clock 58 may be out of phase with one another as shown in FIG. 2C.

When the first clock 56 transitions, the data stored in the first latch 52 is released and is provided to the combinational logic as shown. The data must pass through the combinational logic and arrive at the second latch 54 before the second clock 58 transitions to latch the resulting data. Further, the second latch 54 may have predefined setup and hold time requirements that also must be met.

The critical path algorithm calculates the delay only for the worst case timing path extending between the first latch 52 and the second latch 54. That is, for the combinational logic shown in FIG. 2B, the critical path algorithm may only calculate the delay for path-B 70, which includes or-gate 66, and-gate 62 and exclusive-or gate 68 as shown. The critical path algorithm may not calculate the delay for path-A 64 or path-C 72.

Referring to FIG. 2C, the second clock 58 may transition at time 104. The worst case timing path is path-B 70, because data traveling along path-B 70 does not arrive until after the data has arrived for path-A 64 and path-C 72, as shown. Thus, the critical path algorithm only calculates the delay for path-B 70, regardless of whether any other timing paths fall outside of the timing specification. For example, path-A 64 also arrives after the second clock 58 transitions, but will go undetected by the critical path algorithm.

To correct all timing violations within the design using the critical path algorithm, the designer must correct or mask timing path-B 70, and execute another iteration. During the subsequent iteration, path-A 64 may become the worst case timing path and may then be detected by the critical path algorithm. As can readily be seen, for circuit designs having a number of timing paths that fall outside of the timing specification, a substantial number of iterations may be required.

In a typical design, there may be a number of source latches and a number of destination latches, with combinational logic therebetween. Typically, source latches that are controlled by a common source clock may be grouped together to define a source clock group. In such a configuration, the critical path algorithm may identify a worst case timing path from each source clock group to each destination latch.

The advantage of the critical path algorithm is that the run times may be significantly shorter than for the path enumeration algorithm. However, because only worst case timing paths are identified, the critical path algorithm may require a number of iterations to identify all of the timing paths that fall outside of the timing specification.

Figure 3A:
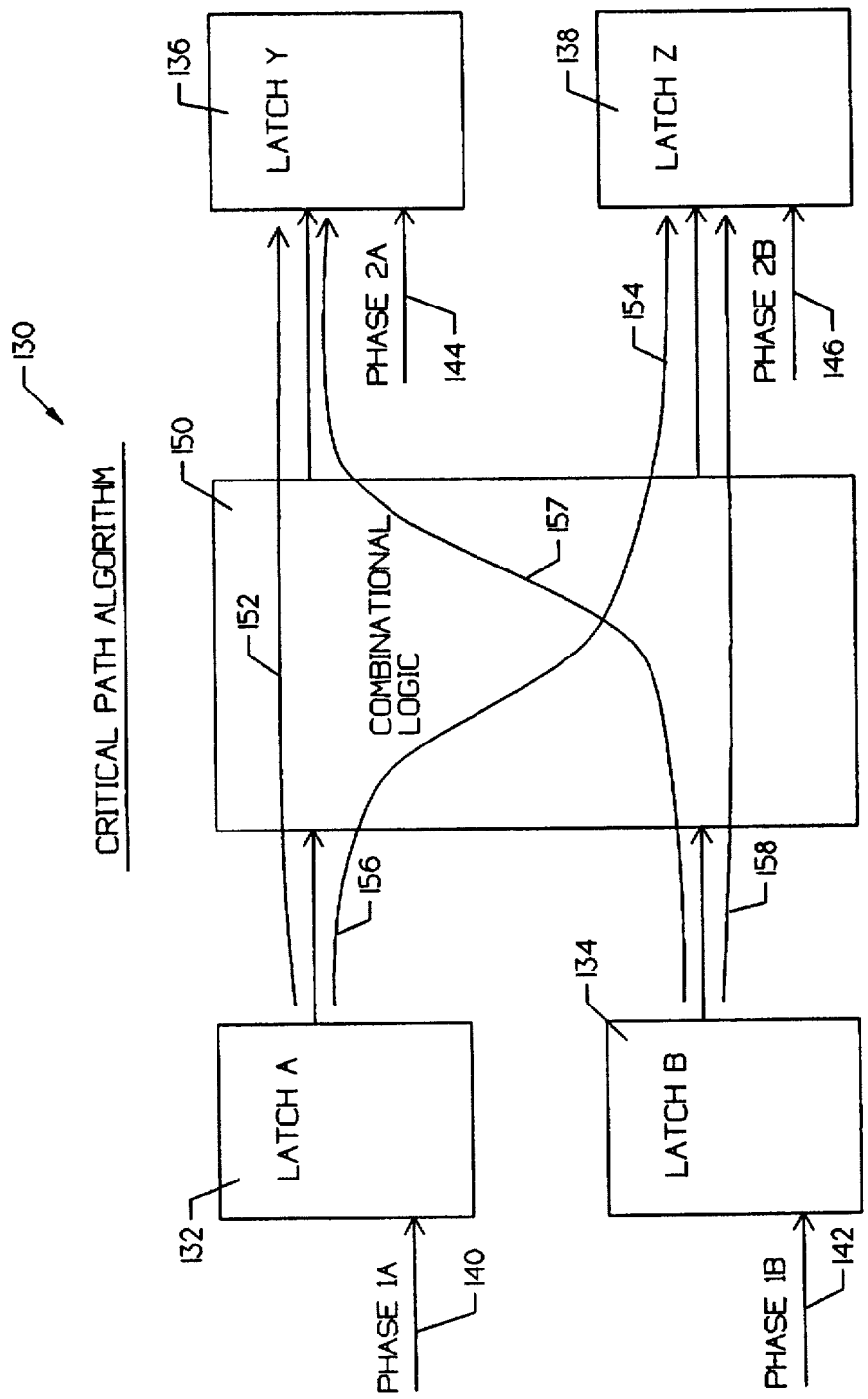
FIG. 3A is a block diagram showing the result of a typical critical path algorithm if a different clock controls each of the source latches.

FIG. 3A is a block diagram showing the result of a typical critical path algorithm if a different clock controls each one of the source latches. The diagram is generally shown at 130. As indicated above, typical critical path algorithms may identify the worst case timing paths between each source clock group and each destination latch.

With reference to FIG. 3A, a first source latch 132 and a second source latch 134 may be provided, wherein the first source latch 132 is controlled by a first source clock 140 and the second source latch 134 is controlled by a second source clock 142. Thus, the first source latch 132 is in a first source clock group and the second source latch 134 is in a second source clock group. Similarly, a first destination latch 136 and a second destination latch 138 may be provided. Combinational logic 150 is provided between the first and second source latches 132, 134, and the first and second destination latches 136, 138.

Figure 3B:
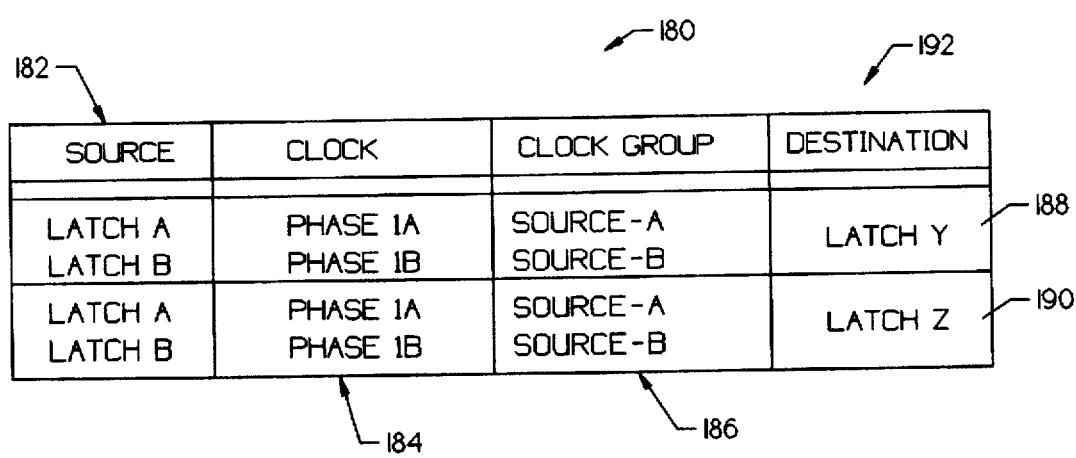
FIG. 3B is a table showing the worst case timing paths traced by the critical path algorithm for the diagram of FIG. 3A.

Referring to FIG. 3B, a table indicating the worst case timing paths traced by a critical path algorithm for the diagram FIG. 3A is shown. The table is generally shown at 180. Column 182 shows each of the latches of FIG. 3A. Column 184 shows the particular clock associated with each of the source latches of FIG. 3A. Column 186 shows the corresponding source clock groups, and column 192 shows the corresponding destination latches.

As indicated above, since each of the source latches is controlled by a unique clock, each of the source latches 132 and 134 is in a separate source clock group, as shown. The critical path algorithm may thus identify the worst case paths, through the combinational logic 150, from each source clock group to each destination latch. As shown at 188, the critical path algorithm may identify the worst case path from latch-A 132 to latch-Y 136, and from latch-B 134 to latch-Y 136. Similarly, as shown at 190, the critical path algorithm may identify the worst case path from latch-A 132 to latch-Z 138, and from latch-B 134 to latch-Z 138.

These worst case paths are graphically shown with reference to FIG. 3A. That is, the critical path algorithm may identify the worst case path from source latch 132 to destination latch 136, as shown at 152; the worst case path from source latch 132 to destination latch 138, as shown at 154; the worst case path from source latch 134 to destination latch 136, as shown at 157; and the worst case path from source latch 134 to destination latch 138, as shown at 158.

It is recognized, however, that most designs do not have a separate clock for each latch in the design. Rather, a number of source latches may be controlled by a common source clock. For example, a number of source latches may be functionally related in a some manner, such as comprising a multiple bit register. Thus, the block diagram shown in FIG. 3A may not reflect a typical design situation.

Figure 4A:
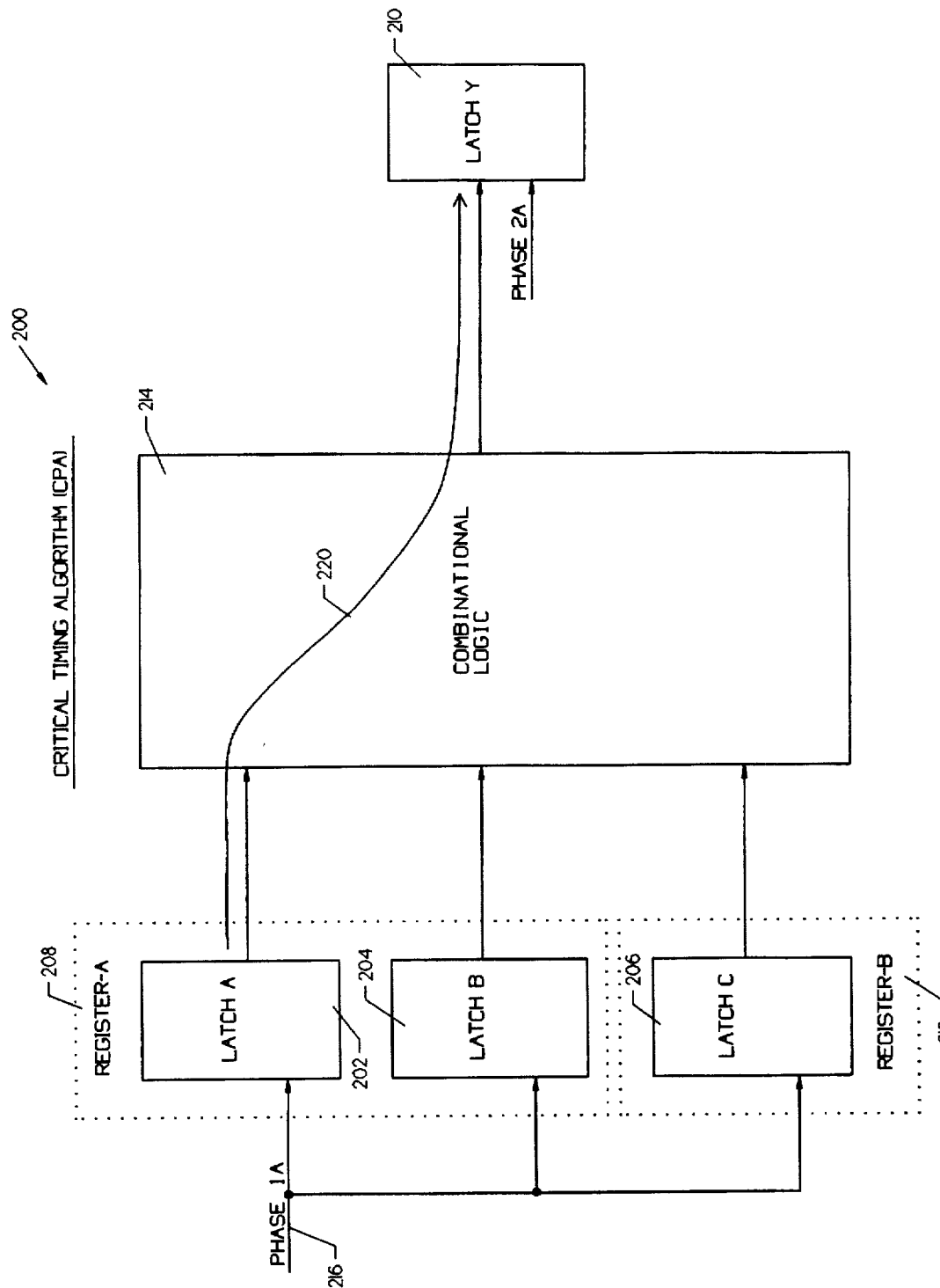
FIG. 4A is a block diagram showing the result of a typical critical path algorithm wherein a common clock controls the source latches.

FIG. 4A is a block diagram showing the result of a typical critical path algorithm wherein a common clock controls a number of source latches. The diagram is generally shown at 200. The block diagram of FIG. 4A is more representative of a typical design situation. First, second and third source latches 202, 204, and 206 are provided. Each of the first, second and third source latches 202, 204 and 206 are controlled by a common source clock 216. For illustrative purposes, source latches 202 and 204 have been shown to be functionally related, by forming a register-A 208. Similarly, source latch 206 forms a register-B 212.

Referring to FIG. 4B, the worst case timing path traced by the critical path algorithm for the diagram shown in FIG. 4A is shown. Column 232 shows each of the source latches of FIG. 4A. Column 234 shows the particular clock associated with each of the source latches of FIG. 4A. Column 236 shows the resulting source clock group. Finally, column 238 shows the destination latch of FIG. 4A. As shown in column 236, all of the source latches are grouped into a single source clock group, namely, source-A.

As indicated above, the critical path algorithm may identify the worst case paths from each source clock group, as shown at column 236, to each destination latch. Referring to the block diagram of FIG. 4A, the critical path algorithm may identify the worst case path extending from source latches 202, 204, and 206, collectively, to the destination latch 210. That is, the critical path algorithm may only identify a single timing path 220 as shown.

To correct all timing violations within a design using a critical path algorithm, the designer must correct or mask the worst case path 220, and execute another iteration. During the subsequent iteration, a new worst case path (not shown) may be identified. As can readily be seen, for circuit designs having a number of timing paths that fall outside of the timing specification, a substantial number of iterations may be required.

The advantage of the critical path algorithm is that the run times may be significantly shorter than for the path enumeration algorithm. However, because only worst case timing paths are identified, the critical path algorithm may require a number of iterations to identify all of the timing paths that fall outside of the timing specification.

FIG. 5A is a block diagram showing a first exemplary embodiment of the present invention wherein a number of pseudo clocks are provided to selected ones of the source latches to increase the number of source clock groups. The diagram is generally shown at 250. The block diagram is similar to the block diagram of FIG. 4A, but a number of "pseudo" clocks have been provided. In the preferred mode, a pseudo clock introducer may be included (see FIGS. 6–12) to introduce the number of pseudo clocks, and provide the pseudo clocks to the timing analysis tool. In a preferred mode, the pseudo clocks are not entered into the design database, but rather are extracted from the design database and provided to the timing analysis tool. The pseudo clock introducer may be implemented in either software running on a data processing system, or in hardware.

The pseudo clock introducer may introduce pseudo clocks for selected ones of the source latches 252, 254 and 256. In the exemplary embodiment of FIG. 5A, the pseudo clock introducer introduces a pseudo clock for each of the source latches as shown. That is, pseudo clocks 270, 272 and 274 are provided to source latches 252, 254 and 256, respectively. In this configuration, the critical path algorithm is "tricked" into identifying worst case timing paths from each of the source latches 252, 254 and 256 to the destination latch 260. That is, rather than only identifying a single timing path as shown in FIG. 4A, the critical path algorithm may identify worst case paths 284, 290, and 304, during a single iteration.

Figure 5B:
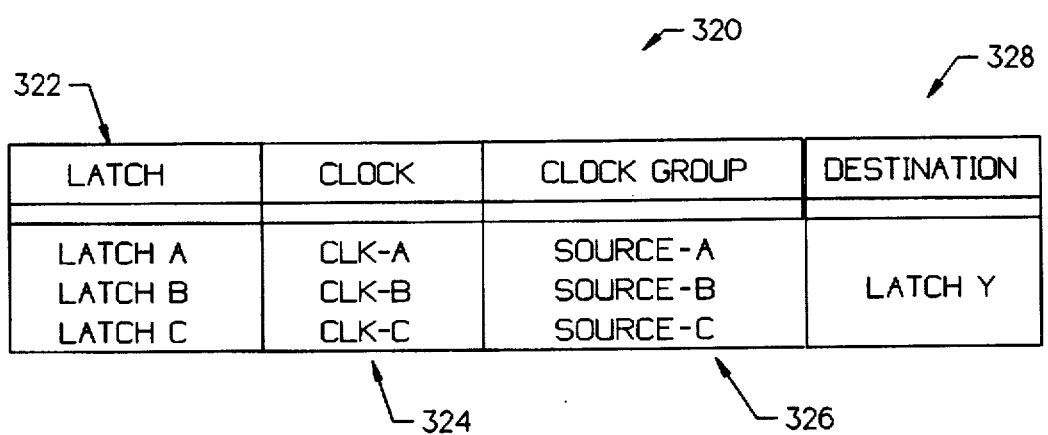
FIG. 5B is a table showing the worst case timing paths traced by the critical path algorithm for the embodiment shown in FIG. 5A.

Referring to FIG. 5B, the worst case timing paths traced by the critical path algorithm for the embodiment shown in FIG. 5A are shown. Column 322 shows each of the source latches of FIG. 5A. Column 324 shows the particular clock associated with each of the source latches of FIG. 5A, including the number of pseudo clocks. Column 326 shows the corresponding source clock groups. Finally, column 328 shows the destination latch-Y 260. As in FIG. 3A, since each of the source latches is controlled by a unique pseudo clock, each of the source latches 252, 254 and 256 is associated with a separate source clock group. Thus, the critical path algorithm may identify the worst case paths from each of the source clock groups to the destination latch 260, as shown.

From this description, it is readily apparent that the present invention is essentially a hybrid between the path enumeration algorithm and the critical path algorithm. As such, the present invention increases the number and degree of timing violations reported by a Critical Path Analysis (CPA) algorithm, while maintaining a performance advantage over a Path Enumeration (PE) algorithm. The introduction of the number of "pseudo" clocks to selected latches within the circuit design database, may trick the CPA algorithm into reporting more timing violations than would otherwise be reported.

Figure 6:
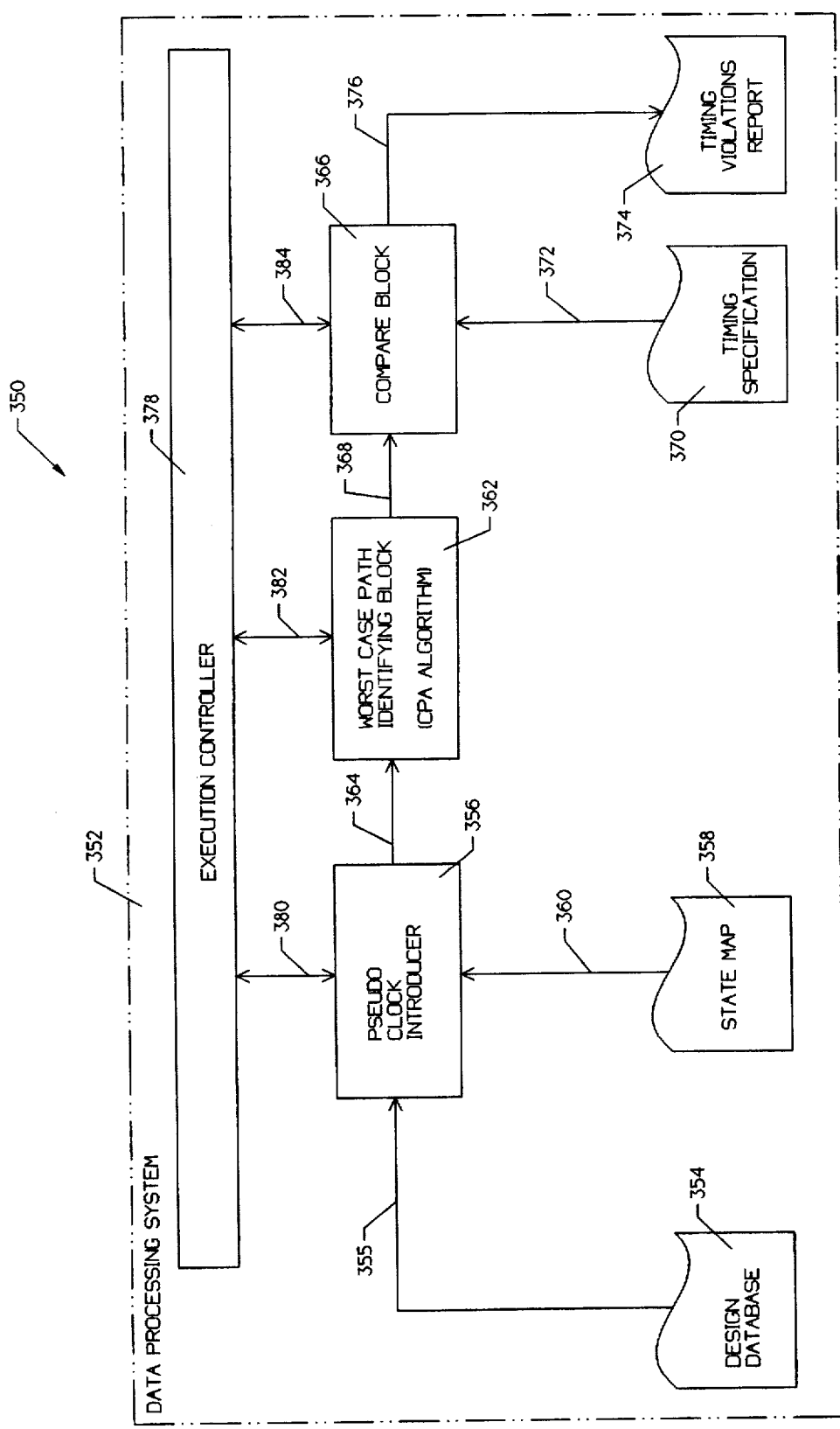
FIG. 6 is a block diagram showing a first exemplary data processing system of the present invention.

FIG. 6 is a block diagram showing a first exemplary data processing system of the present invention. The diagram is generally shown at 350. The exemplary data processing system 352 may provide storage for a design database 354. This storage may be either internal or external to the data processing system 352, and may include RAM, ROM, disk storage, magnetic tape storage, or any other storage medium.

The design database 354 may be provided to a pseudo clock introducer block 356 via interface 355. The pseudo clock introducer block 356 may read a state map 358 via interface 360. The state map may be generated from the design database 354 and may include a list of each latch in the design database 354, and the clock controlling each latch. The data processing system may process the state map, and may assign each of the source latches to a particular source clock group. The state map may be generated by the data processing system 352 generally, the pseudo clock introducer block 356, or by some other means.

The pseudo clock introducer block 356 may then generate a pseudo clock for selected ones of the number of source latches in the design database 354. It is contemplated that the output of the pseudo clock introducer block 356 may be a file containing a list of the pseudo clocks and corresponding latch elements. Alternatively, it is contemplated that the pseudo clock introducer block 356 may actually modify the design database to include the number pseudo clocks.

In either case, the pseudo clock introducer block 356 may provide the design database 354 and the number of pseudo clocks to a worst case path identifying block 362 via interface 364. The worst case path identifying block 362 may include a timing analysis tool utilizing a critical path algorithm. The worst case path identifying block 362 may identify the worst case timing paths from each of the source clock groups to each destination latch, wherein the clock groups may include the pseudo clocks provided by the pseudo clock introducer block 356.

The worst case path identifying block 362 may then provide the worst case timing paths identified thereby to a compare block 366 via interface 368. Compare block 366 may read a predetermined timing specification 370 via interface 372, and may compare each of the worst case timing paths to the predetermined timing specification 370. Compare block 366 may then identify each of the worst case timing paths that fall outside of the predetermined timing specification 370, and provide a timing violations report 374 via interface 376.

It is contemplated that the pseudo clock introducer block 356, the worst case path identifying block 362, and the compare block 366 may be controlled by an execution controller 378 via interfaces 380, 382 and 384, respectively.

Figure 7:
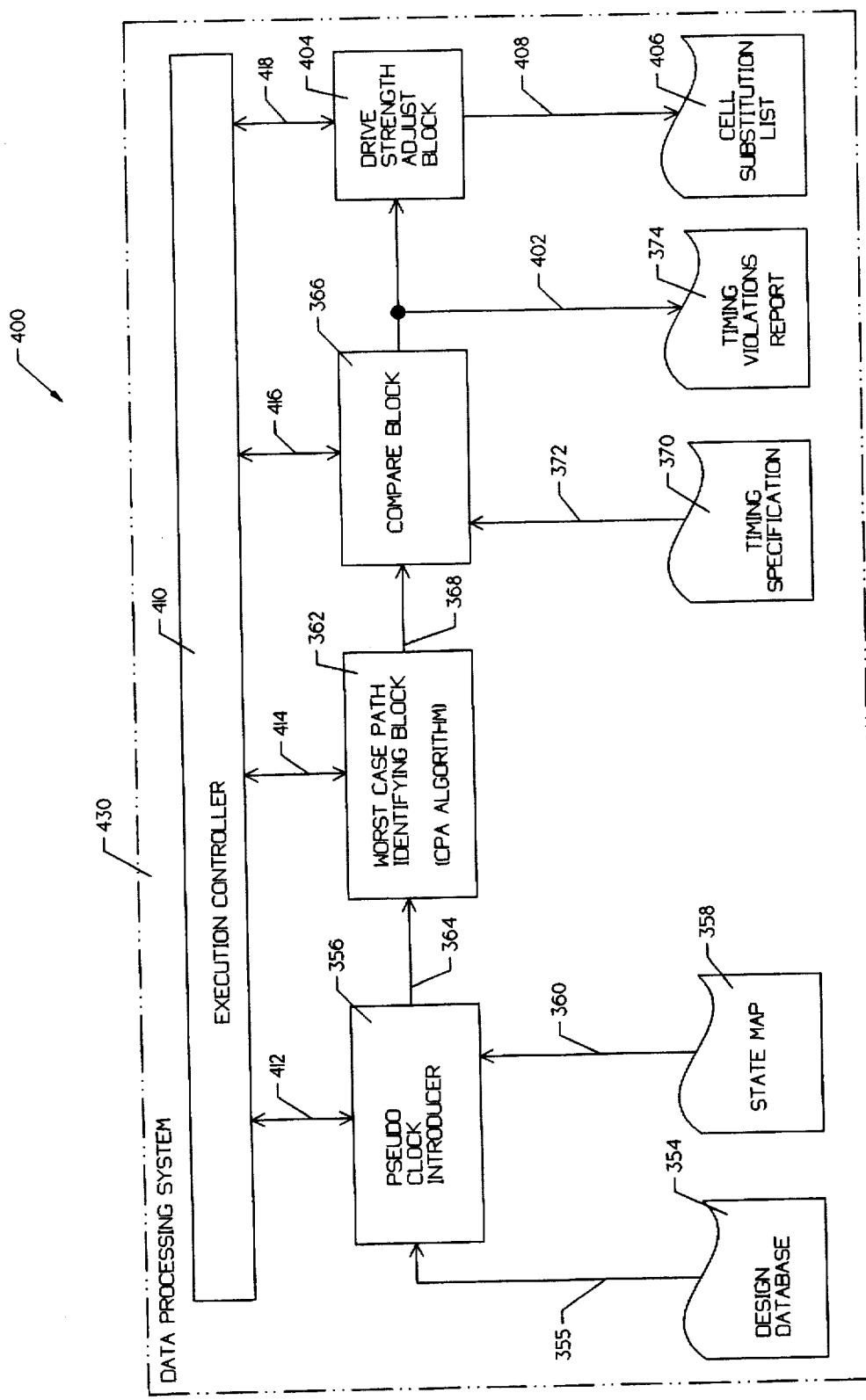
FIG. 7 is a block diagram showing a second exemplary data processing system of the present invention.

FIG. 7 is a block diagram showing a second exemplary data processing system of the present invention. The diagram is generally shown at 400. This embodiment of the present invention is similar to the embodiment shown in FIG. 6, but further includes a drive strength adjust block 404.

It is contemplated that the second exemplary data processing system 430 may provide storage for a design database 354. This storage may be either internal or external to the data processing system 430, and may include RAM, ROM, disk storage, magnetic tape storage, or any other storage medium. The design database 354 may be provided to a pseudo clock introducer block 356 via interface 355.

The pseudo clock introducer block 356 may read a state map 358 via interface 360. The state map may be generated from the design database 354 and may include a list of each latch in the design database 354, and the clock controlling each latch. The data processing system 352 may process the state map, and may assign each of the source latches to a particular source clock group. The state map may be generated by the data processing system 352 generally, the pseudo clock introducer block 356, or by some other means.

The pseudo clock introducer block 356 may then generate a pseudo clock for selected ones of the number of source latches in the design database 354. It is contemplated that the output of the pseudo clock introducer block 356 may be a file containing a list of the pseudo clocks and corresponding latch elements. Alternatively, it is contemplated that the pseudo clock introducer block 356 may actually modify the design database 354 to include the number pseudo clocks.

In either case, the pseudo clock introducer block 356 may provide the design database 354 and the number of pseudo clocks to a worst case path identifying block 362 via interface 364. The worst case path identifying block 362 may include a timing analysis tool utilizing a critical path algorithm. The worst case path identifying block 362 may identify the worst case timing paths from each source clock group to each destination latch, wherein the clock groups may include the pseudo clocks provided by the pseudo clock introducer block 356.

The worst case path identifying block 362 may then provide the worst case timing paths identified thereby to a compare block 366 via interface 368. Compare block 366 may read a predetermined timing specification 370 via interface 372, and may compare each of the worst case timing paths to the predetermined timing specification 370. Compare block 366 may then identify each of the worst case timing paths that fall outside of the predetermined timing specification 370, and provide a timing violations report 374 via interface 402.

Compare block 366 may also provide the worst case timing paths to a drive strength adjust block 404 via interface 402. In a preferred mode, the drive strength adjust block 404 is in accordance with the above referenced U.S. patent application Ser. No. 08/598,506, which is incorporated herein by reference. The drive strength adjust block 404 may identify cells within the design database 354 for substitution with a logically equivalent cell having a different drive strength. The drive strength adjust block 404 may include a resolving means (not shown) for resolving any conflicts that may arise (see FIG. 8). The resolving means may be in accordance with the above referenced U.S. patent application Ser. No. 08/597,931, which is incorporated herein by reference. Finally, it is contemplate that the drive strength adjust block 404 may provide a cell substitution list 406 via interface 408.

Finally, it is contemplated that the pseudo clock introducer block 356, the worst case path identifying block 362, the compare block 366 and the drive strength adjust block 404 may be controlled by an execution controller 410 via interfaces 412, 414, 416 and 418, respectively.

FIG. 8 is a block diagram showing a number of timing paths that share a common component 474. The diagram is generally shown at 450, and shows a limitation of a prior art critical path algorithm when used in conjunction with a drive strength adjust tool.

In the illustrative block diagram, first, second and third source latches 452, 454 and 456 are provided. Each of the first, second and third source latches 452, 454 and 456 are controlled by a common source clock 464, and thus may be associated with a single source clock group. A destination latch 460 is also provided.

As indicated above, the critical path algorithm may identify the worst case path from each source clock group to each destination. Thus, for the block diagram of FIG. 8, the critical path algorithm may identify the worst case timing path from source latches 452, 454 and 456, collectively, to destination latch 460. Thus, in the exemplary diagram, the critical path algorithm may only identify a single timing path-A 476 as shown.

To correct the worst case timing path 476, a drive strength adjust tool may be used to identify cells along timing path-A for substitution with logically equivalent cells having different drive strengths. For example, the drive strength adjust tool may, if appropriate, recommend substituting exclusive-or gate 474 with a logically equivalent component having a different drive strength to reduce the overall path delay of path-A 476.

After the substitution is made, the designer may perform another iteration wherein the critical path algorithm may identify a new worst case path-B 482. Thereafter, the drive strength adjust tool may recommend substituting exclusive-or gate 474 with a logically equivalent component having yet another drive strength. However, the substitution of exclusive-or gate 474 may increase or otherwise effect the delay of path-A 476. Thus, during a subsequent iteration, timing path-A 476 may once again become the worst case timing path. This illustrates one type of conflict that may arise if two or more timing paths include one or more common cells.

Because only the worst case timing paths are identified during a particular iteration, the critical path algorithm will typically not provide a drive strength adjust tool with related timing paths, and thus may make it difficult to resolve potential conflicts as described above. That is, the drive strength adjust tool may recommend a cell substitution during a first iteration, only to cause a second timing path to fall outside of the timing specification. As can readily be seen, the combination of a prior art critical path algorithm and a drive strength adjust tool may not produce a converging solution.

In contrast, the present invention may provide a number of pseudo clocks (not shown) to selected source latches. Thus, as shown in FIG. 5A, the present invention may identify the worst case timing path between each of the source and destination latches. Thus, in the illustrative block diagram of FIG. 8, both path-A 476 and path-B 482 may be identified during a single iteration. With this information, a drive strength adjust tool may resolve any potential conflicts, and may thus provide a converging solution. In a preferred embodiment, it is contemplated that any conflicts may be resolved in accordance with the above referenced U.S. patent application Ser. No. 08/597,931, which has been incorporated herein by reference.

Figure 9:
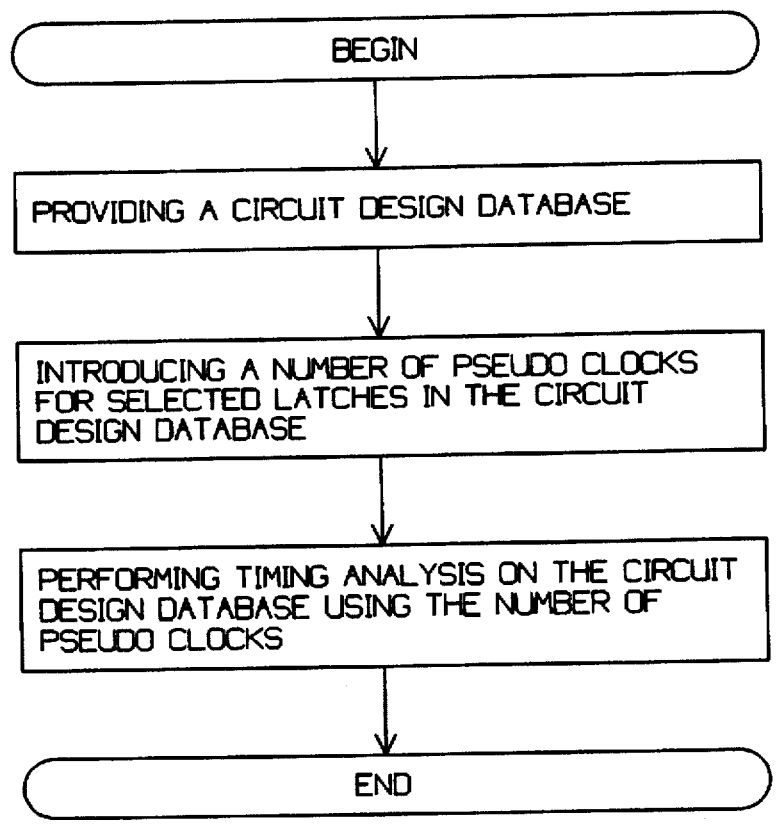
FIG. 9 is a flow diagram showing a first exemplary method of the present invention.

FIG. 9 is a flow diagram showing a first exemplary method of the present invention. The diagram is generally shown at 520. The method is entered at element 522, wherein control is passed to element 524 via interface 526. Element 524 provides a circuit design database. Control is then passed to element 528 via interface 530. Element 528 introduces a number of pseudo clocks for selected latches in the circuit design database. Control is then passed to element 532 via interface 534. Element 532 performs timing analysis on the circuit design database using the number of pseudo clocks. Control is then passed to element 536 via interface 538, wherein the method is exited.

Figure 10:
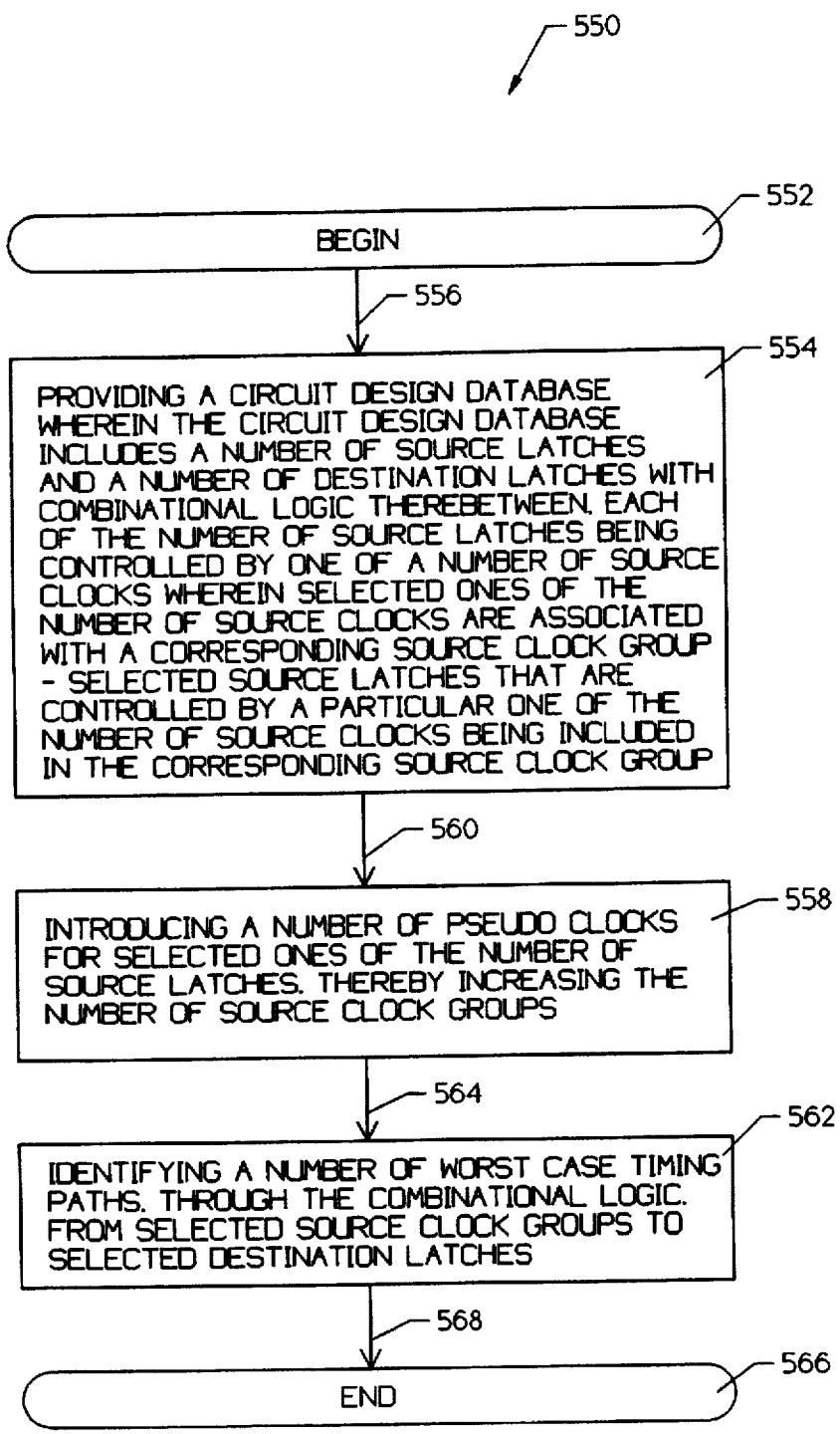
FIG. 10 is a flow diagram showing a second exemplary method of the present invention.

FIG. 10 is a flow diagram showing a second exemplary method of the present invention. The diagram is generally shown at 550. The method is entered at element 552, wherein control is passed to element 554 via interface 556. Element 554 provides a circuit design database, wherein the circuit design database includes a number of source latches and a number of destination latches, with combinational logic therebetween. Each of the number of source latches may be controlled by one of a number of source clocks. Selected ones of the number of source clocks may be associated with a corresponding source clock group, such that selected source latches that are controlled by a particular one of the number of source clocks may be included in the corresponding source clock group.

Control is then passed to element 558 via interface 560. Element 558 introduces a number of pseudo clocks for selected ones of the number of source latches, thereby increasing the number of source clock groups. Control is then passed to element 562 via interface 564. Element 562 identifies a number of worst case timing paths, through the combinational logic, from selected source clock groups to selected destination latches. Control is then passed to element 566 via interface 568, wherein the method is exited.

Figure 11:
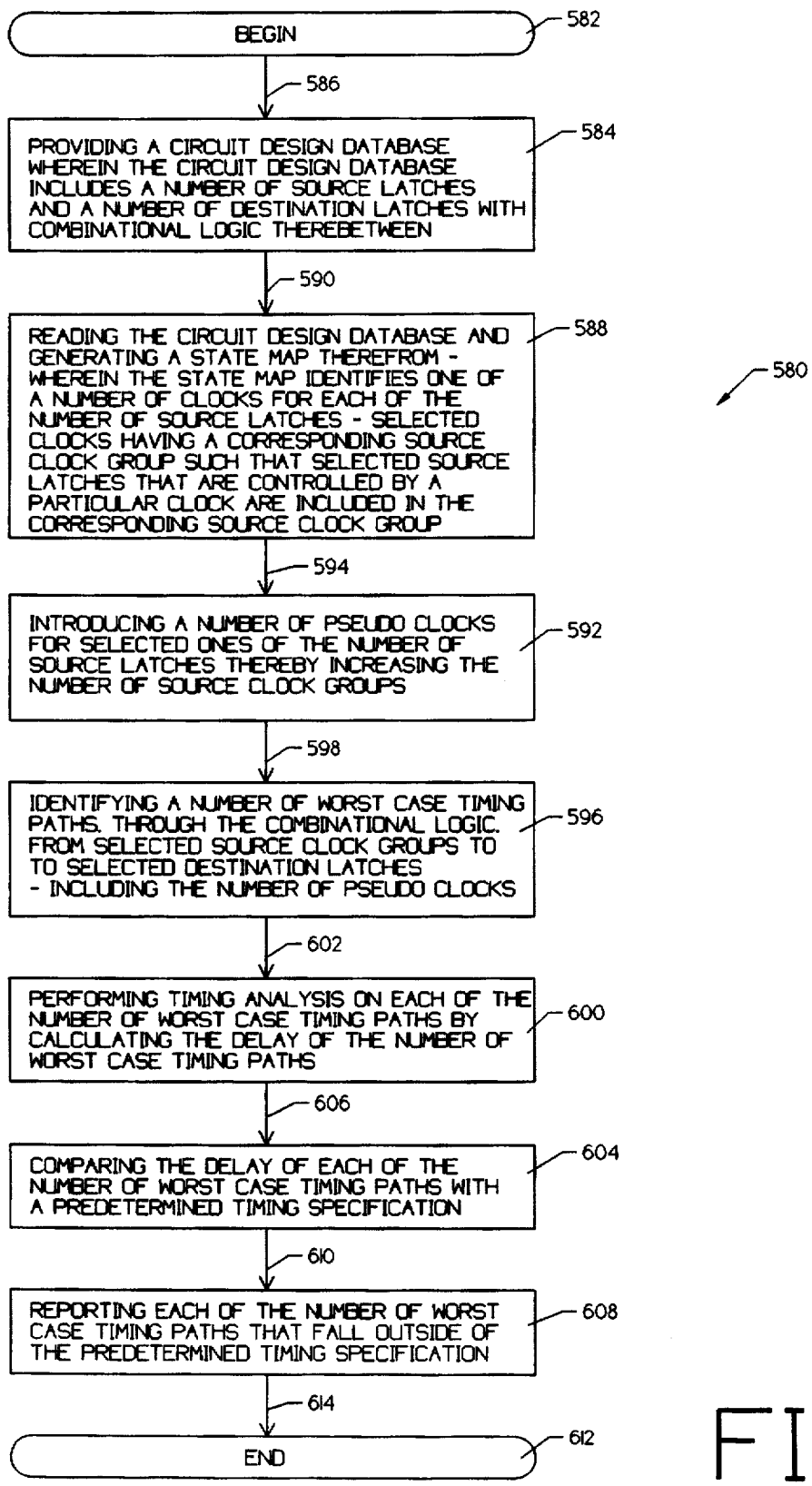
FIG. 11 is a flow diagram showing a third exemplary method of the present invention.

FIG. 11 is a flow diagram showing a third exemplary method of the present invention. The diagram is generally shown at 580. The method is entered at element 582, wherein control is passed to element 584 via interface 586. Element 584 provides a circuit design database, wherein the circuit design database includes a number of source latches and a number of destination latches, with combinational logic therebetween. Control is then passed to element 588 via interface 590. Element 588 reads the circuit design database and generates a state map therefrom. The state map identifies one of a number of clocks for each of the number of source latches. It is contemplated that selected clocks may have a corresponding source clock group associated therewith, such that selected source latches that are controlled by a particular clock may be included in the corresponding source clock group.

Control is then passed to element 592 via interface 594. Element 592 introduces a number of pseudo clocks for selected ones of the number of source latches, thereby increasing the number of source clock groups. Control is then passed to element 596 via interface 598.

Element 596 identifies a number of worst case timing paths, through the combinational logic, from selected source clock groups to selected destination latches. Control is then passed to element 600 via interface 602. Element 600 performs timing analysis on each of the number of worst case timing paths by calculating the delay of the number of worst case timing paths. Control is then passed to element 604 via interface 606. Element 604 compares the delay of each of the number of worst case timing paths with a predetermines timing specification. Control is then passed to element 608 via interface 610. Element 608 reports each of the number of worst case timing paths that fall outside of the predetermined timing specification. Control is then passed to element 612 via interface 614, wherein the method is exited.

Figure 12A:
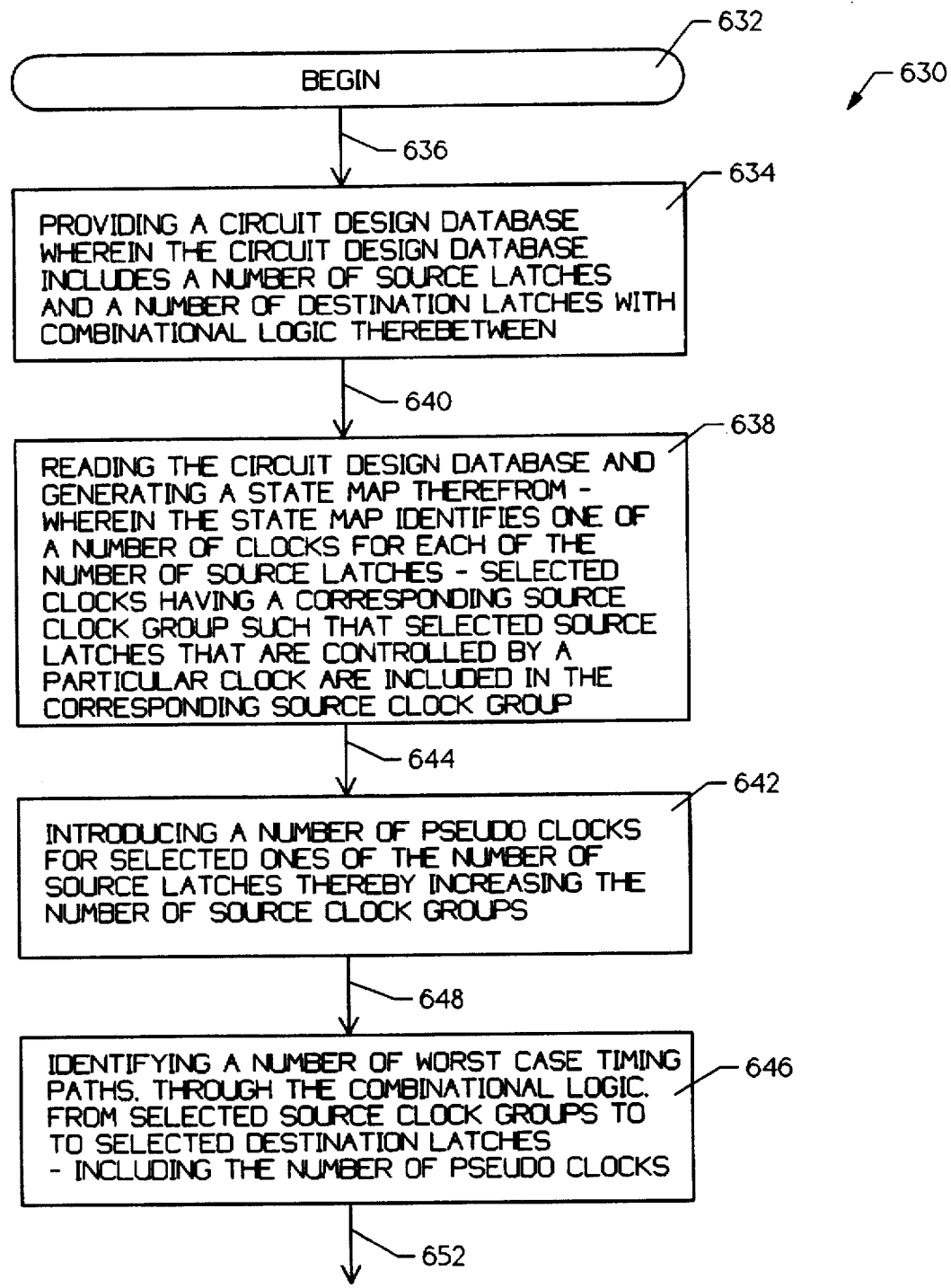
FIG. 12A and FIG. 12B comprise a flow diagram showing a fourth exemplary method of the present invention.
Figure 12B:
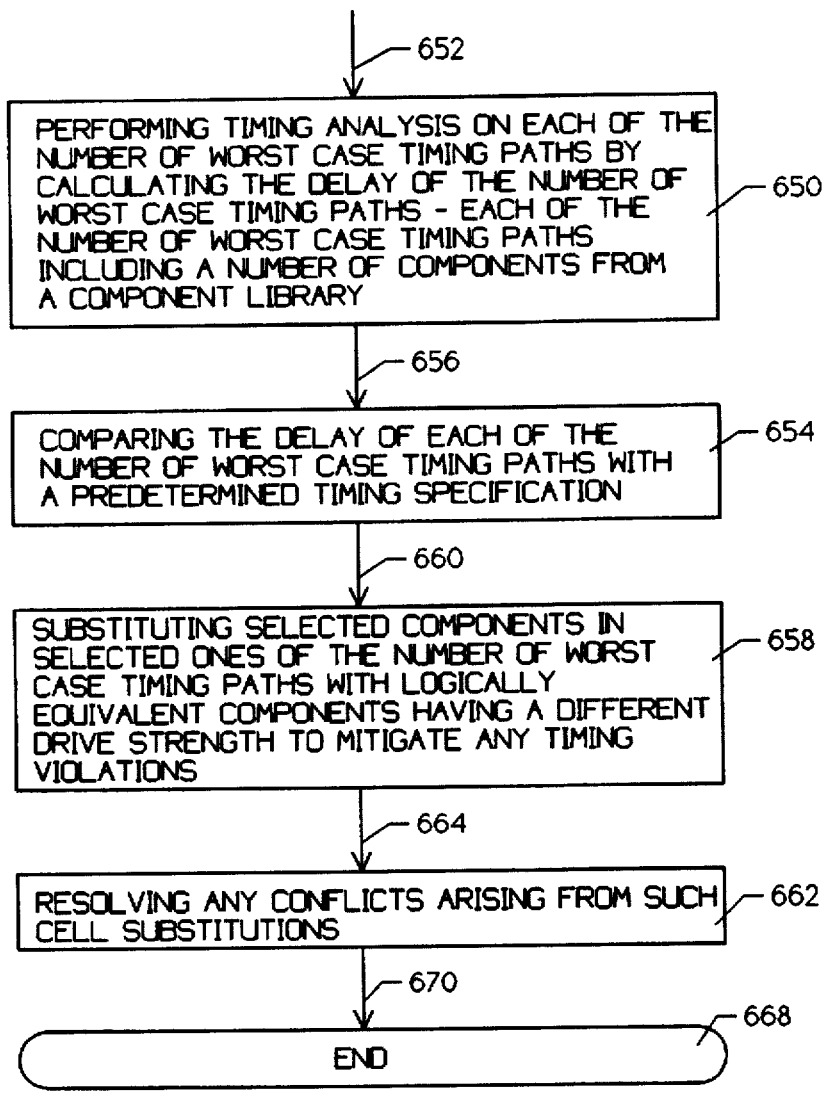

FIG. 12A and FIG. 12B comprise a flow diagram showing a fourth exemplary method of the present invention. The diagram is generally shown at 630. The method is entered at element 632, wherein control is passed to element 634 via interface 636. Element 634 provides a circuit design database, wherein the circuit design database includes a number of source latches and a number of destination latches, with combinational logic therebetween. Control is then passed to element 638 via interface 640. Element 638 reads the circuit design database and generates a state map therefrom. The state map identifies one of a number of clocks for each of the number of source latches. It is contemplated that selected clocks may have a corresponding source clock group associated therewith, such that selected source latches that are controlled by a particular clock may be included in the corresponding source clock group.

Control is then passed to element 642 via interface 644. Element 642 introduces a number of pseudo clocks for selected ones of the number of the source latches, thereby increasing the number of source clock groups. Control is then passed to element 646 via interface 648. Element 646 identifies a number of worst case timing paths, through the combinational logic, from selected source clock groups to selected destination latches, including the number of pseudo clocks. Control is then passed to element 650 via interface 652. Element 650 performs timing analysis on each of the number of worst case timing paths by calculating the delay of the number of worst case timing paths. Each of the number of worst case timing paths including a number of components from a component library. Control is then passed to element 654 via interface 656. Element 654 compares the delay of each of the number of worst case timing paths with a predetermined timing specification. Control is then passed to element 658 via interface 660.

Element 658 substitutes selected components in selected ones of the number of worst case timing paths with logically equivalent components having a different drive strength to mitigate any timing violations. Control is then passed to element 662 via interface 664. Element 662 resolves any conflicts arising from such cell substitutions. Control is then passed to element 668 via interface 670, wherein the method is exited.

Having thus described the preferred embodiments of the present invention, those of skill in the art will readily appreciate that the teachings found herein may be applied to yet other embodiments within the scope of the claims hereto attached.

We claim:

1. A data processing system for identifying timing violations in a circuit design, wherein the circuit design is represented in a circuit design database including a number of source latches each having an output, and a number of destination latches each having an input, the circuit design database further including combinational logic coupled to the output of the number of source latches and to the input of the number of destination latches, the circuit design database further having a number of source clocks for controlling the number of source latches wherein selected ones of the number of source clocks are associated with a corresponding source clock group, selected source latches that are controlled by a particular one of the number of source clocks are associated with the corresponding source clock group, the data processing system being programmed to identify the worst case timing paths, through the combinational logic, from selected source clock groups to selected destination latches, the data processing system comprising:

a. introducing means for introducing a number of source pseudo clocks wherein each of the number of source pseudo clocks corresponds to a predetermined one of the number of source latches, thereby increasing the number of source clock groups; and b. identifying means coupled to said introducing means for identifying the worst case timing paths, through the combinational logic, from selected source clock groups to selected destination latches.

2. A data processing system according to claim 1 wherein said introducing means reads a state map wherein said state map includes a predetermined list of selected ones of the number of source latches, said state map being processed by a processing means to create the number of source pseudo clocks for the predetermined source latches.

3. A data processing system according to claim 1 further comprising analyzing means coupled to said identifying means for analyzing the number of worst case timing paths, said analyzing means calculating the delay of the number of worst case timing paths.

4. A data processing system according to claim 3 further comprising comparing means coupled to said analyzing means for comparing the delay of the number of worst case timing paths with a predetermined specification.

5. A data processing system according to claim 4 wherein said comparing means compares the delay of the number of worst case timing paths and determines if predetermined setup and hold time specifications are met for selected destination latches, and for identifying the worst case timing paths that are responsible thereof.

6. A data processing system according to claim 5 wherein said combinational logic includes a number of components selected from a component library, predetermined components of the component library having at least one corresponding logically equivalent component with a different drive strength, each of the number of worst case timing paths comprising a number of components.

7. A data processing system according to claim 6 further comprising substituting means for substituting selected components with a corresponding logically equivalent component having a different drive strength, said substituting means substituting selected components along the worst case timing paths identified by said comparing means.

8. A method of identifying timing violations in a circuit design, wherein the circuit design is represented in a circuit design database including a number of source latches each having an output, and a number of destination latches each having an input, the circuit design database further including combinational logic coupled to the output of the number of source latches and to the input of the number of destination latches, the circuit design database further having a number of source clocks for controlling the number of source latches wherein selected ones of the number of source clocks are associated with a corresponding source clock group, selected source latches that are controlled by a particular one of the number of source clocks are associated with the corresponding source clock group, the data processing system being programmed to identify the worst case timing paths, through the combinational logic, from selected source clock groups to selected destination latches, the method comprising the steps of:

a. introducing a number of source pseudo clocks corresponding to predetermined ones of the number of source latches, thereby increasing the number of source clock groups; and b. identifying the worst case timing paths, through the combinational logic, from selected source clock groups to selected destination latches.

9. A method according to claim 8 wherein the combinational logic includes a number of components selected from a component library, predetermined components of the component library having at least one corresponding logically equivalent component with a different drive strength, each of the worst case timing paths comprising a number of components.

10. A method according to claim 9 further comprising the steps of:

c. analyzing the delay of the worst case timing paths within the circuit design by calculating the delay of selected components along each of the worst case timing paths and summing the delays of the selected components;

d. comparing the delay of each worst case timing path with a predefined specification;

e. reporting a violation if the delay along a selected worst case timing path is determined to exceed the predefined specification;

f. substituting selected components along selected worst case timing paths with the corresponding logically equivalent component having a different drive strength to improve the delay of the corresponding worst case timing path; and g. repeating steps (a) through (f) for a predetermined number of iterations.

11. A method according to claim 10 wherein said substituting step further comprises the step of resolving any conflicts between the substituted components if a substituted component resides in two or more of the worst case timing paths.

12. A method according to claim 11 wherein said resolving step resolves any conflicts using a predetermined priority scheme.

* * * * *